(12) United States Patent
Terao et al.

(10) Patent No.: US 6,358,065 B1
(45) Date of Patent: Mar. 19, 2002

(54) DISPLAY UNIT INSTALLING AND CONNECTING DEVICE

(75) Inventors: Shinichi Terao, Tokyo; Noriyoshi Satoh; Toshiyasu Kitamura, both of Kanagawa, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/437,935

(22) Filed: Nov. 10, 1999

(30) Foreign Application Priority Data

Nov. 11, 1998 (JP) .......................................... 10-335012

(51) Int. Cl.[7] .............................................. H01R 12/00
(52) U.S. Cl. ......................... 439/67; 439/493; 349/150
(58) Field of Search ............................ 439/67, 66, 68, 439/69, 70, 71, 72, 493; 349/149–152

(56) References Cited

U.S. PATENT DOCUMENTS 4,913,656 A * 4/1990 Gordon et al. ................ 439/67
5,358,412 A * 10/1994 Maurinus et al. .............. 439/66
6,068,514 A * 5/2000 Zuin ........................... 439/630

* cited by examiner

Primary Examiner—Tho D. Ta
Assistant Examiner—James R. Harvey
(74) Attorney, Agent, or Firm—Pearne & Gordon LLP

(57) ABSTRACT

A display unit installing and connecting device comprising a liquid crystal display unit 11, a holding member 10 for holding the liquid crystal display unit 11 and a flexible printed circuit board 12 connected to the liquid crystal display unit 11, a printed circuit board 20 to which the holding member 10 is fitted, spring bodies 21 mounted on the print board 20 and having a plurality of conductive springs 25 molded with resin. The flexible printed circuit board 12 is folded at the outside of the holding member 10. The device further includes means for electrically connecting the print board 20 and the flexible printed circuit board 12 by means of spring force of the spring bodies 21, whereby the print board 20 and the flexible printed circuit board 12 are electrically connected by means of spring force by the spring bodies 21.

18 Claims, 4 Drawing Sheets

DISPLAY UNIT INSTALLING AND CONNECTING DEVICE

BACKGROUND OF THE INVENTION

The present invention relates to a display unit installing and connecting device, and more particularly to a structure which is so constructed that a flexible base plate which is a flexible printed circuit board is folded at the outside of a holding member and urged by means of spring bodies thereby to electrically connect a print board and the flexible base plate, with no need of preparing a connecting terminal formed on the flexible printed circuit board and a connector to be connected thereto.

Conventionally, a display unit installing and connecting device such as the one disclosed in the Unexamined Japanese Patent Application Publication No. Hei 9-288278, for example, has been known. As shown in FIGS. 4 and 5, the conventional display unit installing and connecting device is of such a construction that a back light 3 which serves as a light conductor for conducting lights from a light emitting element 5 to illuminate a liquid crystal display unit 1 from backward is arranged in the rear of the liquid crystal display unit 1, and a flexible base plate 2 connected to the liquid crystal display unit 1 by means of a conductive adhesive 7 is folded in an approximately C-shape, and fixed by means of interposing members 6, and a connecting terminal 8 formed on the flexible base plate 2 is guided to the rear and outward of the back light 3 and connected there with a connecting member such as a connector which is not shown.

As described, in the structure of the conventional display unit installing and connecting device, the back light 3 and the flexible base plate 2 are fixed by means of the interposing member 6. There has been a problem that this fixing operation requires manual labor, which results in an increase of the cost. Moreover, the connecting terminal 8 formed on the flexible base plate 2 is guided outward and connected there to the connector or the like. This incurs another problem of fitting and connecting operation that the connecting terminal 8 and the connector to be connected thereto must be additionally prepared.

With a view to overcoming the above described problems, it is an object of the present invention to provide a display unit installing and connecting device which is inexpensive and reliable in connection, and so constructed that the liquid crystal display unit, the light conductive plate and the flexible base plate can be held by means of a holding member having positioning bosses and engaging claws, that the holding member and a main print board (or printed circuit board) are connected by means of the engaging claws, and that the flexible base plate and the main print board are connected by means of spring bodies provided on the print board.

SUMMARY OF THE INVENTION

In order to solve the above described problem, a display unit installing and connecting device according to the present invention comprises a liquid crystal display unit, a flexible base plate which is a flexible printed circuit board connected to the liquid crystal display unit, a holding member for holding the liquid crystal display unit, a print board (or printed circuit board) to which the holding member is fitted, and spring bodies mounted on the print board and having a plurality of conductive springs molded with resin, the flexible base plate being folded at the outside of the holding member, characterized in that the device is further provided with means for electrically connecting the print board to the flexible base plate by means of spring force of the spring bodies.

The invention according to a second aspect of the present invention is embodied in a connecting device comprising a display unit, a flexible base plate connected to the display unit and formed with contact portions on its one face, a holding member for holding the flexible base plate or the display unit, a print board arranged facing with the flexible base plate, and springs provided between the print board and the flexible base plate to electrically connect both of them, characterized in that the flexible base plate is adapted to contact the holding member while urged by means of the springs.

This device has an effect that the print board and the flexible base plate are electrically connected to each other by the spring force by means of the spring body.

The invention according to a third aspect is embodied in a connecting device comprising a liquid crystal display unit including a pair of base plates having a transparent electrode at their inner faces and enclosing therein a liquid crystal composition, a holding member having positioning bosses erected on its rear face and engaging claws in its bottom part which are engageable with the print board, and a flexible base plate electrically communicating with the liquid crystal display unit and folded in an approximately C-shape at its forward end which is provided with positioning holes and contact portions adapted to be electrically connected to below-mentioned springs, characterized in that the print board is provided with positioning holes, a plurality of conductive springs and light emitting elements, and that the liquid crystal display unit is held by the holding member with the positioning bosses inserted through the positioning holes in the print board, and with the engaging claws engaged at determined positions of the print board, whereby forced portions of the springs and the contact portions provided on the flexible base plate are fitted and connected to each other.

This structure has an effect that the forced portions of the spring bodies and the contact portions provided on the flexible base plate can be precisely fitted and connected to each other.

The invention according to a fourth aspect is embodied in a connecting device as claimed in any one of the first through third aspects wherein the flexible base plate is provided with the contact portions on its one face along opposite edges which are substantially perpendicular to the folded forward end, and the springs are provided at positions corresponding to the contact portions.

This structure has an effect that the forced portions of the spring bodies and the contact portions provided on the flexible base plate can be precisely fitted and connected to each other.

The invention according to a fifth aspect is embodied in a connecting device as claimed in the first through third aspects, wherein the contact portions formed in the flexible base plate are arranged so as to be substantially symmetrical with respect to a center thereof.

This structure has an effect that the forced portions of the spring bodies and the contact portions provided on the flexible base plate can be precisely fitted and connected to each other with a good balance.

The invention according to a sixth aspect is embodied in a connecting device as claimed in the third aspect, wherein the light emitting elements are adapted to be encased in the holding member, and after they have been encased, radiant lights projected from the light emitting elements are conducted to the light conductive plate by means of a reflecting face provided on the holding member.

This structure has an effect that the radiant light from the light emitting elements are conducted to the light conductive plate by means of the reflecting face provided on the holding member.

The invention according to a seventh aspect is embodied in a connecting device as claimed in the third aspect, wherein the light emitting elements provided on the print board are located further in front of the folded forward end of the flexible base plate.

With this arrangement, the radiant light from the light emitting elements are conducted to the light conductive plate by means of the reflecting face provided on the holding member.

The invention according to a ninth aspect is embodied in a connecting device as claimed in any one of the first through third aspects, wherein each of the springs is formed of a metal piece folded to have a spring characteristic.

This feature has an effect that the metal pieces of the conductive springs are bent to have a spring characteristic.

The invention according to a tenth aspect is embodied in a connecting device as claimed in any one of the first through third aspects, wherein each of the springs includes a plane parallel to the print board on which they are mounted.

This feature has an effect that a plurality of the conductive springs can be mounted in parallel to the print board.

The invention according to an eleventh aspect is embodied in a connecting device as claimed in any one of the first through third aspects, wherein each of the springs is bent and its distal end is directed downward.

Because each of the conductive springs are bent and the distal end is directed downward, a sufficient spring characteristic can be assured.

The invention according to a twelfth aspect is embodied in a connecting device as claimed in any one of the first through third aspects, wherein the springs mounting area of the print board on which the springs are mounted, and the contact portions of the flexible base plate are provided with the same kind of metal coatings.

This feature has an effect that contact resistance will be reduced and potential difference of the contact portions can be eliminated.

The invention according to a fourteenth aspect 14 is embodied in a display unit installing and connecting device as claimed in the second or third aspects, wherein a plurality of the conductive springs are all formed of the same metal pieces.

Because of the same metal pieces, a plurality of the conductive springs can be easily manufactured.

DETAILED DESCRIPTION OF THE PREFERRED EMBODIMENTS

Now, a mode for carrying out the present invention will be described with reference to FIGS. 1 to 3.

Figure 1:
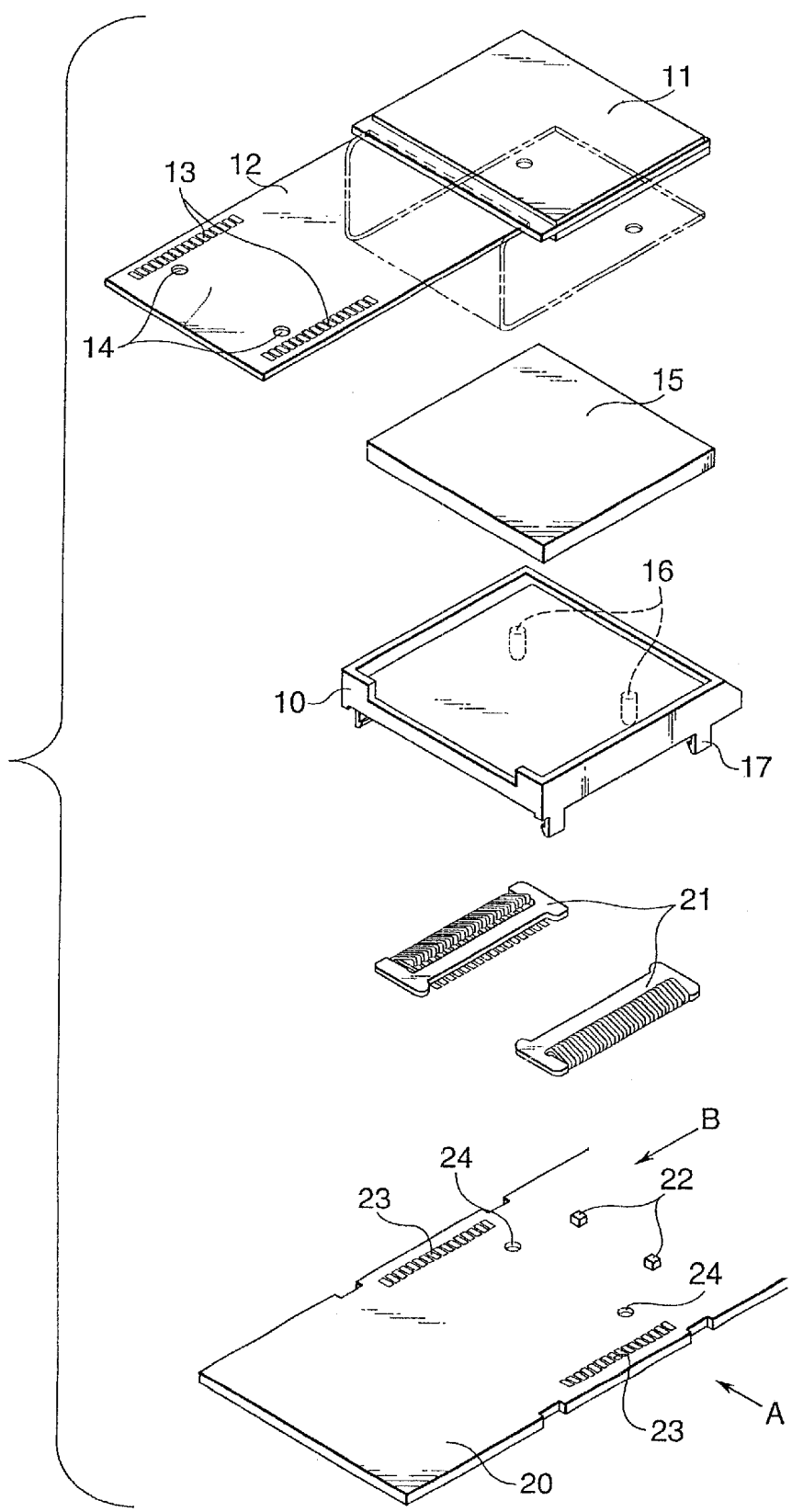
FIG. 1 is an exploded view of a display unit installing and connecting device in one embodiment of the present invention.

FIG. 1 shows a structure of the display unit installing and connecting device in one embodiment according to the present invention. In FIG. 1, the display unit installing and connecting device mainly consists of a holding member 10 to which a liquid crystal display unit 11 and a flexible printed circuit board 12 (flexible base plate) are fitted to be held, and a print board 20 provided with light emitting elements (LED chips) 22 and spring bodies 21 with which conductive springs are molded with resin.

In the forward end of the flexible printed circuit board 12, are formed contact portions 13 and positioning holes 14. Further, the holding member 10 has engaging claws 17 in its bottom part and positioning bosses 16 in the back face thereof.

Now, fitting and connecting operation of the display unit installing and connecting device in the embodiment according to the present invention will be schematically described. In FIG. 1, the light conductive plate 15 is first placed on a front face of the holding member 10, and then, the liquid crystal display unit 11 is placed on the holding member 10. The liquid crystal display unit has been assembled with the flexible printed circuit board 12 to which a transparent electrode (not shown) of the liquid crystal display element has already been connected by means of conductive adhesive or the like.

The forward end of the flexible printed circuit board 12 is projected from the side face of the holding member 10 where an opening is set to have a width corresponding to a lateral edge of the flexible printed circuit board 12, and then, folded backward in an approximately C-shape.

Through the positioning holes 14 formed in the forward end of the flexible printed circuit board 12 are passed the positioning bosses 16 at the rear face of the holding member 10. Accordingly, the contact portions 13 formed in the forward end of the flexible printed circuit board 12 are made so as to face with the spring bodies 21 of the print board 20. This means that the contact portions 13 formed on the flexible printed circuit board 12 are made symmetrical at the lateral edge of the flexible printed circuit board 12, while the spring bodies 21 corresponding to the contact portions 13 are also made symmetrical.

Then, the engaging claws 17 of the holding member 10 in which the liquid crystal display unit 11, etc. are assembled and held are locked at determined positions of the print board 20, that are, in recesses formed at longitudinal edges of the print board 20, and at the same time, the positioning bosses 16 of the holding member 10 are inserted into positioning holes 24 formed at lateral edges of the print board 20. As a result, the contact portions 13 formed at the forward end of the flexible printed circuit board 12 folded in the rear of the holding member 10 in which the liquid crystal display unit 11, etc. are assembled and held come into contact with forced portions of the spring bodies 21 by spring force.

Figure 2:
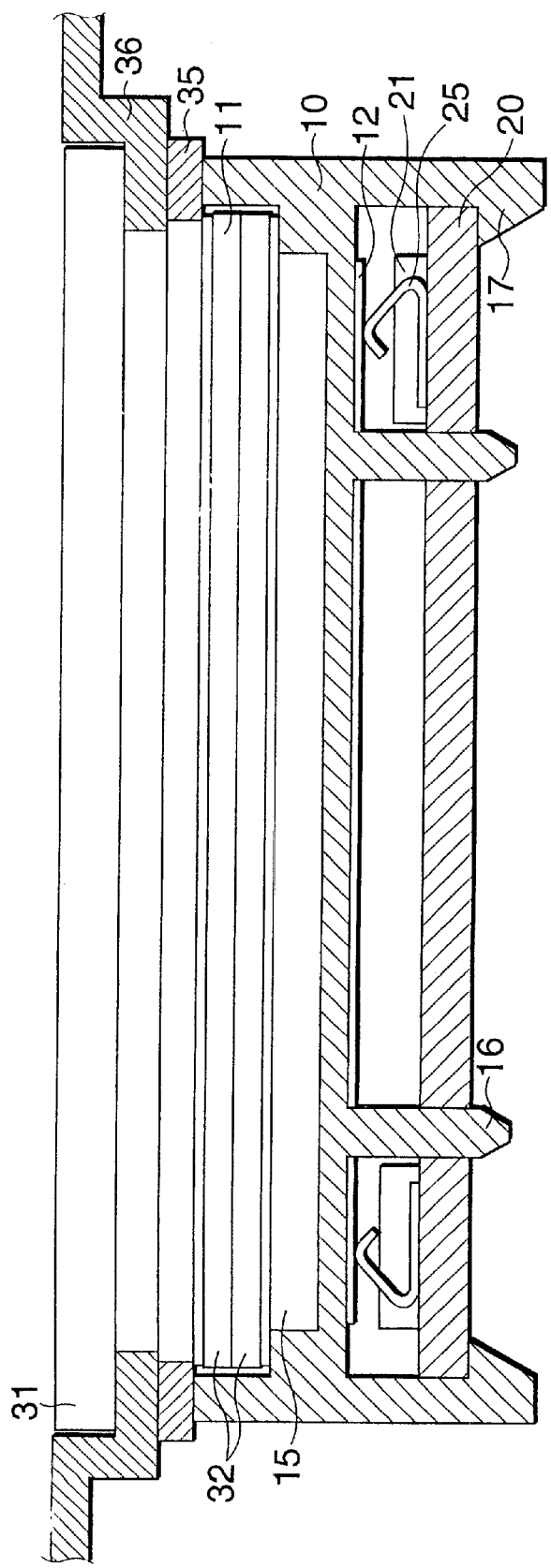
FIG. 2 is a sectional view of the display unit installing and connecting device in the embodiment of the present invention taken in a direction A of FIG. 1.
Figure 3:
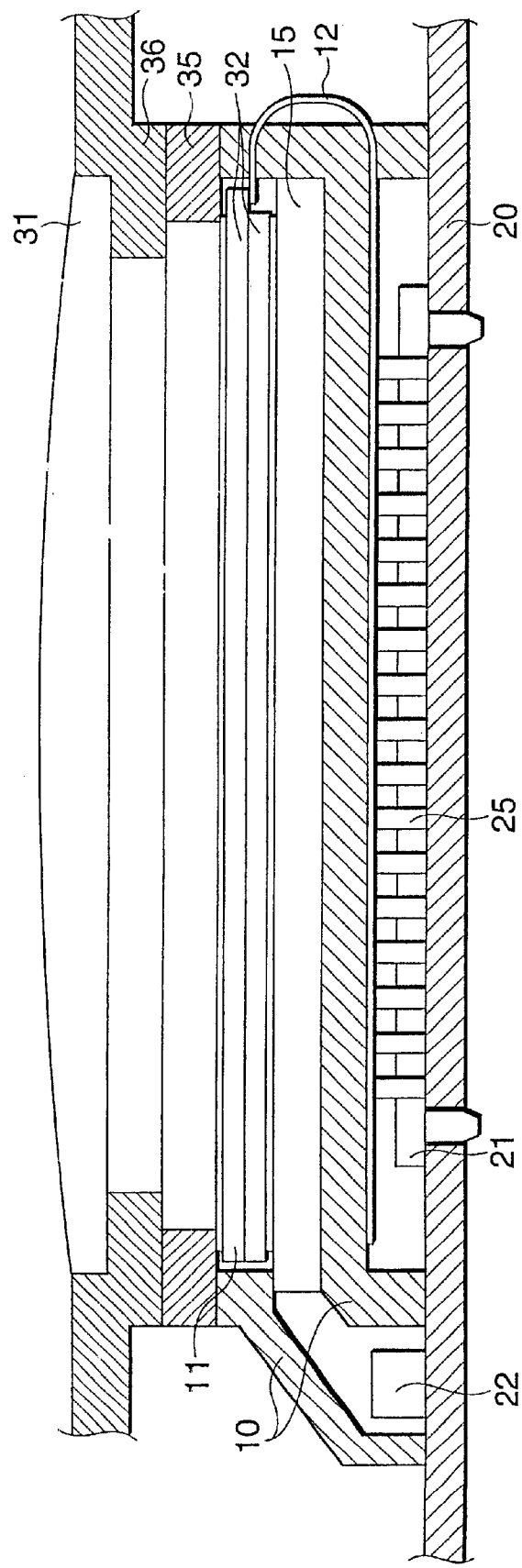
FIG. 3 is a sectional view of the display unit installing and connecting device in the embodiment of the present invention taken in a direction B of FIG. 1.
Figure 4:
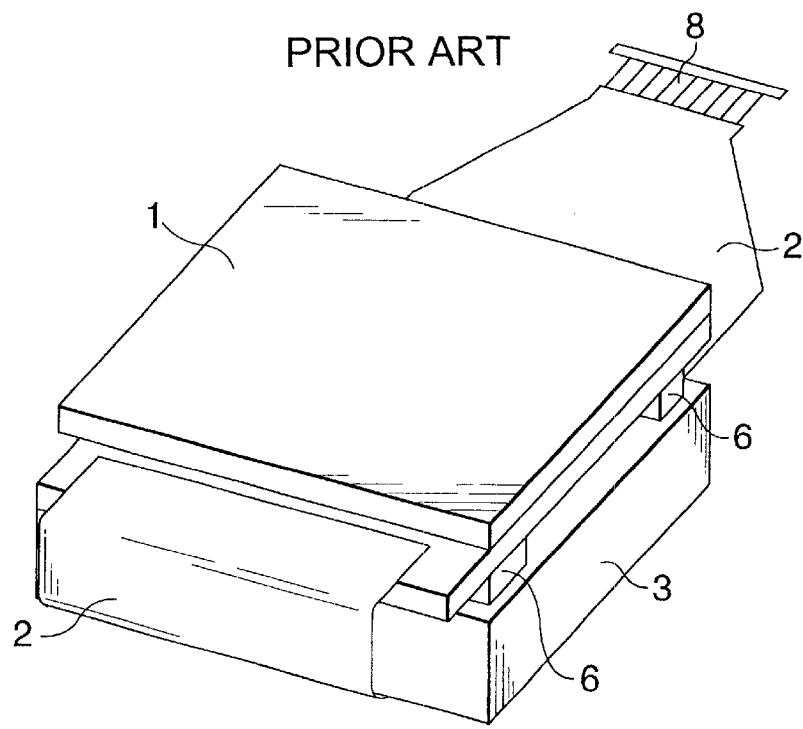
FIG. 4 is a perspective view of the conventional display unit installing and connecting device.
Figure 5:
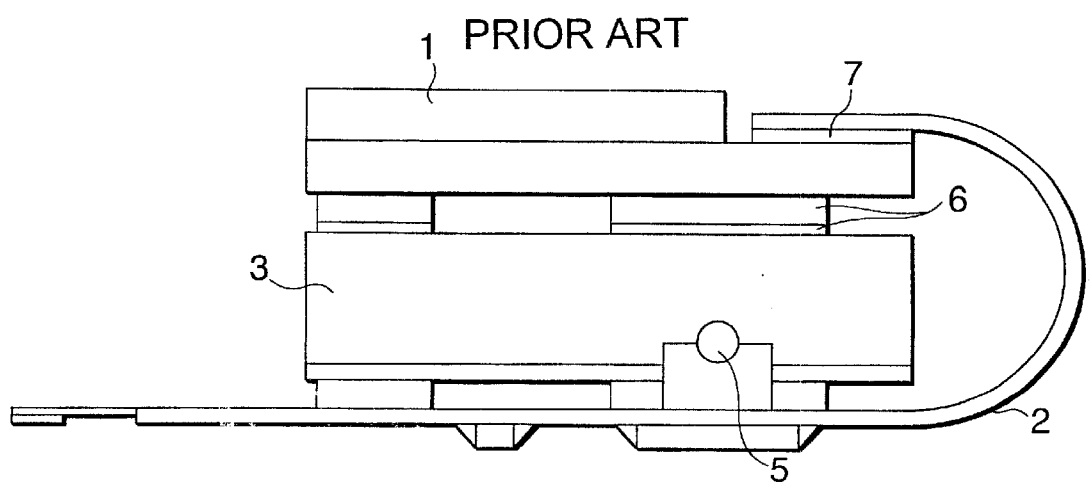
FIG. 5 is a sectional side view of the conventional display unit installing and connecting device.

The display unit installing and connecting device thus fitted and connected is shown in FIGS. 2 and 3. FIG. 2 is a sectional view taken in a direction A in FIG. 1.

It is apparent from FIG. 2 that the bosses 16 of the holding member 10 are inserted through the positioning holes 24 of the print board 20, and that the engaging claws 17 are locked at the determined positions of the print board 20. As a result, the contact portions 13 formed in the forward end of the flexible printed circuit board 12 and the forced portion formed in the conductive spring 25 of the spring bodies 21 are connected respectively with each other by a determined contact pressure.

In FIG. 2, the liquid crystal display unit which is composed of a glass plate 32, an LCD (liquid crystal display) element (not shown) and a transparent electrode (not shown) is placed on the light conductive plate 15. The liquid crystal display unit is positioned under a transparent plate 31 which is placed on a cover 36 through cushions 35 provided on a periphery of the holding member 10.

FIG. 3 is a sectional view of the display unit installing and connecting device taken in a direction B of FIG. 1. It is apparent from FIG. 3 that the light emitting elements (LED chips) 22 are encased in the holding member 10 and that radiant light projected from the light emitting elements 22 is conducted to the light conductive plate 15 by means of a reflecting face formed on the holding member 10.

It will be further understood that the contact portion 13 and the forced portion formed on the conductive spring 25 of the spring body 21 are in contact and connected with each other. FIG. 3 illustrates the case where 16 conductive springs are provided on each of the spring bodies 21, but this is only an example to which the present invention is not limited.

In FIG. 3 as well as in FIG. 2, the liquid crystal display unit is composed of the glass plate 32, the LCD (liquid crystal display) element (not shown) and the transparent electrode (not shown) is placed on the light conductive plate 15. The liquid crystal display unit is positioned under the transparent plate 31 which is placed on the cover 36 through the cushions 35 provided on the periphery of the holding member 10.

It will be understood from FIG. 3 that the transparent plate 31 is in a form of a lens so that the contents of the display unit can be seen in an enlarged scale. The spring bodies 21 are mounted on the print board 20, and so constructed that a plurality of the conductive springs molded with resin and the contact portions 23 formed on the print board are connected with each other at the lower part of the spring bodies 21. It will be further noted that each of the spring bodies 21 is provided with bosses which are inserted through the print board 20.

Now, the contact portion 13 in the flexible printed circuit board 12 will be further explained. There is formed on the flexible printed circuit board 12 an exposed conductive part which is composed of a patterned copper and covered with metal plating of nickel and gold.

The conductive spring is formed of spring beryllium copper or spring phosphorus bronze as a raw material, and covered with metal plating of nickel and gold.

The conductive spring consists of a horizontal portion, and a first and second bent portions. One end of the horizontal portion is bent upward arcuately to form the first bent portion, and the first bent portion is bent downward arcuately from a forward end thereof to form the second bent portion, which serves as the contact portion.

The first bent portion is imparted with spring characteristic. A projected area of the conductive spring can be made small by thus bending it and the device can be made compact.

Due to the presence of the second bent portion, the arcuate bent area is adapted to abut the contact portion 13 of the flexible printed circuit board 12 which is assembled from the above. Because the distal end of the spring is bent, the distal end will not abut the contact portion 13 of the flexible printed circuit board 12 thereby preventing damages of the contact portion 13 of the flexible printed circuit board 12, and erosion of the contact portion 13 will be avoided.

The spring body is integrally formed with a plurality of the conductive springs of the same shape which have been previously inserted in metal molds for mold forming. The horizontal portion of the conductive spring is so shaped as to be parallel to the print board on which the spring is mounted, and therefore, suitable for re-flowing when mounted on a land of the print board, thereby affording a good mounting ability.

Moreover, a plurality of the conductive springs are made the same in shape, which gives them the same spring characteristics, and a uniform spring force can be given to each contact portion, thereby assuring a stable contact. Further, since all the molds are of the same shape, only a single type of metal mold is sufficient and the production cost will be reduced.

As described in the above, all of the conductive springs (both the contact portion and the horizontal portion), the mounting area (land) of the print board on which the conductive springs are mounted, and the contact portions of the flexible printed circuit board are provided with a metal plating of gold on their surfaces.

This will decrease contact resistance and eliminate the potential difference of the contact portions, thereby preventing electric erosion and assuring a stable contact.

In a space between the holding member and the print board, the folded part of the flexible printed circuit board is arranged in one direction, while in the opposite direction thereto the light emitting elements are arranged. In a direction perpendicular to the above directions are mounted the spring bodies at both ends.

With the described structure, the space between the holding member and the print board can be effectively utilized, and thus the device can be made compact.

In this embodiment, the flexible printed circuit board is formed with the exposed areas of the conductive body to which the contact portions of the springs are abutted, thereby to electrically connect the print board and the liquid crystal display unit. However, in a modified embodiment, the end portion of the flexible printed circuit board may be connected to a second print board on which the conductive body is provided, and the print board of the main body and the second print board are so arranged as to face with each other, with this spring body mounted on one of the print boards so that it may abut the other print board.

In FIGS. 1 to 3, there is illustrated no controlling LSI to be mounted on the flexible printed circuit board 12 for controlling the liquid crystal display unit. Because it is well known with respect to TAB (Tape-Automated-Bonding) etc. to install the controlling LSI, the illustration has been omitted here.

The display unit installing and connecting device according to the present invention, so constructed as described above comprises a liquid crystal display unit, a flexible printed circuit board connected to the liquid crystal display unit, a holding member for holding the liquid crystal display unit, a print board to which the holding member is fitted, and spring bodies mounted on the print board and having a plurality of conductive springs molded with resin, the flexible printed circuit board being folded at the outside of the holding member, characterized in that the device is further provided with means for electrically connecting the print board to the flexible printed circuit board by means of spring force of the spring bodies. This device has an effect that the print board and the flexible printed circuit board are electrically connected to each other by the spring force by means of the spring body.

The display unit installing and connecting device according to the present invention being thus constructed, there is no need of preparing the connecting terminal formed on the flexible printed circuit board and the connector to be connected thereto, and the print board and the flexible printed circuit board can be electrically connected with a simple operation by the spring force.

What is claimed is:

1. A display unit connecting device comprising:
   a liquid crystal display unit;
   a flexible printed circuit board with one end electrically connected to said liquid crystal display unit;
   a holding member for holding said liquid crystal display unit;
   a printed circuit board arranged with said holding member;
   a spring body provided on said printed circuit board including plural electrically conductive springs over-molded by resin, said spring body urging another end of said flexible printed circuit board, wherein said spring body provides electrically connecting means for electrically connecting between said printed circuit board and said another end of said flexible printed circuit board.

2. A display unit connecting device comprising:
   a liquid crystal display unit;
   a flexible printed circuit board with a first end electrically connected to said liquid crystal display unit;
   a printed circuit board arranged facing with said flexible printed circuit board;
   a spring body provided between a second end of said flexible printed circuit board and said printed circuit board, said spring body including plural electrically conductive springs over-molded by resin, wherein
   said spring body is provided with electrically connecting means for electrically connecting between said printed circuit board and said second end of said flexible printed circuit board by urging one of said second end of said flexible printed circuit board and said printed circuit board towards the other with said spring body.

3. A display unit connecting device comprising:
   a liquid crystal display unit;
   a flexible printed circuit board with a first end electrically connected to said liquid crystal display unit;
   a first printed circuit board electrically connected to said flexible printed circuit board;
   a holding member for holding said liquid crystal display unit;
   a second printed circuit board provided with said holding member; and
   a spring body including plural electrically conductive springs over-molded by resin, wherein
   said spring body is provided with electrically connecting means for electrically connecting between said second printed circuit board and a second end of said flexible printed circuit board by urging one of said printed circuit boards towards the other with said spring body.

4. The connecting device as claimed in any one of claims 1 to 3, wherein
   each of said springs includes a plurality of springs molded with resin to compose a spring body.

5. The connecting device as claimed in any one of claims 1 to 3, wherein
   each of said springs is formed of a metal piece folded to a have spring characteristic.

6. The connecting device as claimed in any one of claims 1 to 3, wherein
   each of said springs includes a plane parallel to said printed circuit board on which said springs are mounted.

7. The connecting device as claimed in any one of claims 1 to 3, wherein
   each of said springs is bent and a distal end thereof is directed downward.

8. The connecting device as claimed in any one of claims 1 to 3, wherein
   a same kind of metal are coated on said springs, mounting area of said printed circuit board on which said springs are mounted, and said contact portions of said flexible base plate.

9. The connecting device as claimed in any one of claims 1 to 3, wherein
   forced portions of said springs mounted on said printed circuit board are exposed outward; and
   said flexible printed circuit board is assembled onto said springs from above, such that
   said printed circuit board and said flexible printed circuit board are electrically connected to each other.

10. The display unit installing and connecting device as claimed in claims 1 to 3, wherein
    a plurality of said conductive springs are all formed of the same metal pieces.

11. The connecting device as claimed in claim 1, 2, or 3 wherein:
    a holding member having positioning bosses erected on a rear face and engaging claws in a bottom part, said engaging claws are engageable with said printed circuit board;
    said flexible printed circuit board being folded in an approximately C-shape at a forward end which is provided with positioning holes and contact portions adapted to be electrically connected to springs on said spring body, wherein said printed circuit board is provided with positioning holes; and
    said liquid crystal display unit is held by said holding member with said positioning bosses inserted through said positioning holes in said printed circuit board, with said engaging claws engaged at determined positions of said printed circuit board; such that
    forced portions of said springs and said contact portions provided on said flexible printed circuit board are fitted and connected to each other.

12. The connecting device as claimed in claim 11, wherein
    said flexible printed circuit board is provided with said contact portions on one face thereof along opposite edges which are substantially perpendicular to said folded forward end; and said springs are provided at positions corresponding to said contact portions.

13. The connecting device as claimed in claim 11, wherein said contact portions formed in said flexible printed circuit board are arranged so as to be substantially symmetrical with respect to a center thereof.

14. The connecting device as claimed in claim 11, wherein said contact portions formed in said flexible printed circuit board are arranged so as to be substantially symmetrical with respect to a center thereof.

15. The connecting device as claimed in claim 11, wherein light emitting elements are adapted to be encased in said holding member, and after being encased, radiant lights projected from said light emitting elements are conducted to said light conductive plate by means of a reflecting face provided on said holding member.

16. The connecting device as claimed in claim 11, wherein light emitting elements provided on said print board are located further in front of said folded forward end of said flexible base plate.

17. The display unit installing and connecting device as claimed in claim 11, wherein a plurality of said conductive springs are all formed of the same metal pieces.

18. The connecting device according to claim 11 wherein said liquid crystal display unit is adapted to be mounted on said holding member by dropping said liquid crystal display unit onto said holding member, wherein said positioning bosses are inserted through said positioning holes in said printed circuit board; and further wherein, by pressing said liquid crystal display unit into place, said engaging claws engage said determined positions of said printed circuit board, such that said forced portions of said springs and said contact portions provided on said flexible printed circuit board are fitted and connected to each other.

* * * * *

UNITED STATES PATENT AND TRADEMARK OFFICE
CERTIFICATE OF CORRECTION

PATENT NO. : 6,358,065 B1
DATED : March 19, 2002
INVENTOR(S) : Shinichi Terao, Noriyoshi Satoh and Toshiyasu Kitamura It is certified that error appears in the above-identified patent and that said Letters Patent is hereby corrected as shown below:

Column 1,
Line 59, please delete "which is a flexible printed circuit board", and insert therefor -- (which is a flexible printed circuit board) --.

Column 2,
Line 56, please delete "through", and insert therefor -- or the --.
Line 57, please delete "aspects", and insert therefor -- aspect --.
Line 65, please delete "the", and insert therefor -- a --.

Column 3,
Line 48, please delete "aspects", and insert therefor -- aspect --.

Column 8,
Line 11, please delete "a have", and insert therefor -- have a --.
Line 35, after "from", please insert -- the --.

Signed and Sealed this

Sixth Day of August, 2002

Attest:

Attesting Officer

JAMES E. ROGAN
*Director of the United States Patent and Trademark Office*